United States Patent
Märtens et al.

(10) Patent No.: US 8,854,030 B2
(45) Date of Patent: Oct. 7, 2014

(54) METHOD AND DEVICE FOR FREQUENCY RESPONSE MEASUREMENT

(75) Inventors: Olev Märtens, Tallinn (EE); Mart Minn, Tallinn (EE); Raul Land, Tallinn (EE); Paul Annus, Tallinn (EE); Tõnis Saar, Tallinn (EE); Marko Reidla, Tartumaa (EE)

(73) Assignees: Tallinn University of Technology, Tallinn (EE); OÜ ELIKO Technoloogia Arenduskeskus, Tallinn (EE)

( * ) Notice: Subject to any disclaimer, the term of this patent is extended or adjusted under 35 U.S.C. 154(b) by 470 days.

(21) Appl. No.: 13/177,961

(22) Filed: Jul. 7, 2011

(65) Prior Publication Data

US 2012/0007583 A1    Jan. 12, 2012

(51) Int. Cl.
*G01R 23/02*    (2006.01)
*G01R 31/3163*    (2006.01)

(52) U.S. Cl.
CPC ............................... *G01R 31/3163* (2013.01)
USPC ...................................................... 324/76.39

(58) Field of Classification Search
None
See application file for complete search history.

(56) References Cited

U.S. PATENT DOCUMENTS

| | | | |
|---|---|---|---|
| 4,945,234 A * | 7/1990 | Goodman et al. | 250/291 |
| 5,797,840 A | 8/1998 | Akselrod et al. | |
| 6,501,807 B1 | 12/2002 | Chieu et al. | |
| 6,885,960 B2 | 4/2005 | Wagner et al. | |
| 7,428,683 B2 | 9/2008 | Dai et al. | |
| 7,580,643 B2 * | 8/2009 | Moore et al. | 398/202 |
| 7,782,248 B2 * | 8/2010 | Kwak et al. | 342/145 |
| 2006/0176980 A1 | 8/2006 | Lee | |
| 2010/0026496 A1 * | 2/2010 | Martens et al. | 340/572.1 |
| 2010/0225303 A1 * | 9/2010 | Min et al. | 324/76.24 |

FOREIGN PATENT DOCUMENTS

WO    00/63830 A2    10/2000

OTHER PUBLICATIONS

PCT Search Report dated May 19, 2008 of Patent Application No. PCT/EE2008/000001 filed Jan. 23, 2008.
"FPGA-Based Analog Functional Measurements for Adaptive Control in Mixed-Signal Systems", BIST, 2007.
"Influence of the Analyzing Window on Electrode Measurement by the Continuous Frequency Scanning Method", Journal of Electroanalytical Chemistry, Sep. 2002, pp. 25-31, vol. 533, Issue 1-2.

* cited by examiner

*Primary Examiner* — Paresh Patel
(74) *Attorney, Agent, or Firm* — Maine Cernota & Rardin

(57) ABSTRACT

A method is provided for measuring a frequency response of an object, the method involving: generating an excitation signal having relatively fast changing frequency, defined by a time-domain function; generating at least one reference signal, having a waveform corresponding to the excitation signal; introducing the excitation signal into the object; receiving a response signal from the object; analyzing said response signal in a signal analyzer by correlating the response signal with at least one reference signal during a relatively short sliding time-domain window.

17 Claims, 1 Drawing Sheet

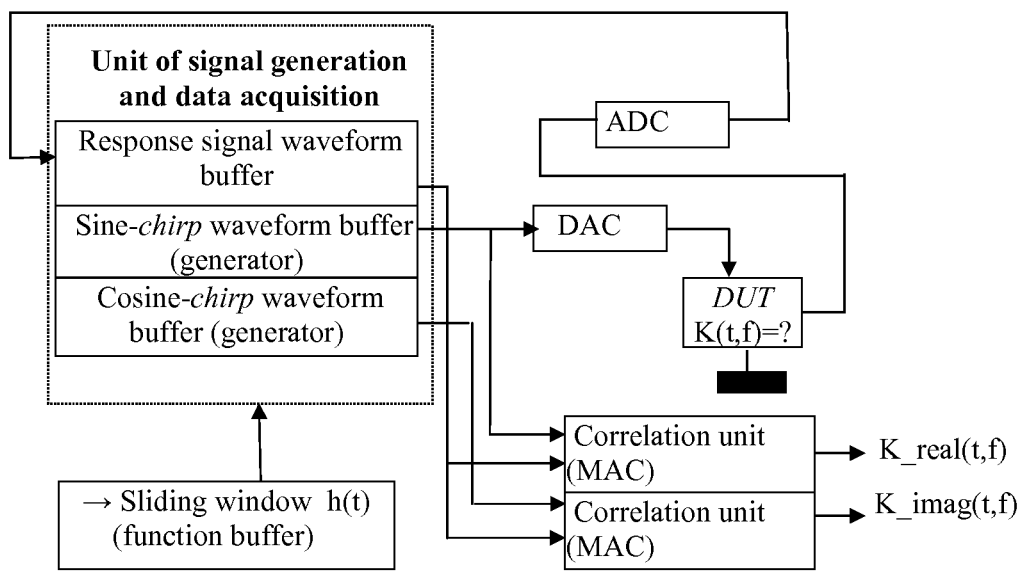

METHOD AND DEVICE FOR FREQUENCY RESPONSE MEASUREMENT

BACKGROUND OF THE INVENTION

1. Technical field

The invention relates to measurement techniques, particularly to the field of measurement of the frequency response. For example, included in this field are electrical network and vector-impedance analyzers which measure the transfer coefficient as a function of the frequency. The invention can be used in bio-impedance measurement devices for medical diagnosis, in testers of electrical and electronics circuits, in analyzers of electrochemical elements for their condition monitoring, for investigating of materials by their electrical properties (e.g., conductivity) and also for many other applications.

2. Background art

Solutions are known, where the transfer coefficient of the circuit is measured by applying an excitation signal (e.g., of sinusoidal waveform) to the measured circuit and by multiplying and accumulating of the response signal waveform to this excitation signal, or in other words, by correlating (which is a practical equivalent to mathematical convolution) of these signals, and carried out, in digital implementation, by multiply-and-accumulate (MAC) unit. Also second, quadrature (90 degrees shifted, from excitation signal) reference signal for second correlation (quadrature result component) could be used (U.S. Pat. No. 7,428,683). Correlation calculation can often include also normalization of the result, taking into account average levels and amplitudes (intensities) of the signals.

Such solution is also described in the paper, "FPGA-Based Analog Functional Measurements for Adaptive Control in Mixed-Signal Systems", JIE QIN et al, August 2007, for BIST, the device consisting of numerically controlled oscillators, digital-to-analog converter and analog-to-digital converter and adjusted for applying excitation signal to an object (e.g., circuit under test and reading back the response signal from the object, and numerical multiplier and accumulator to analyze the properties of the object under test. The disadvantage of such solutions is that the result is calculated by correlation of the reference and response signals as one integral value over the full measurement cycle and therefore such measurement is not showing the transfer coefficient separately for individual frequencies (that means, frequency response) and secondly, such integral measurement is not reflecting correctly and in real-time dynamical, changing in time circuit or object.

For measurement of the frequency response, including dynamic (fast changing in time) circuits and objects, the technical solutions are known, where wideband, e.g., chirp excitation signal are used, and the response signal is analyzed in relatively short sliding time-domain-window by frequency analysis, e.g., by short-time Fourier' transform (STFT) or by wavelet analysis, as described in U.S. Pat. Nos. 6,885,960 and 5,797,840.

The closest solution known in the art is described in the paper "Influence of the analyzing window on electrode impedance measurement by the continuous frequency scanning method", K. Darowicki, P. Slepski, Journal of Electroanalytical Chemistry, Vol 533, Issues 1-2, 20 Sep. 2002, pp 25-31. In this solution a linear chirp signal is generated for an excitation signal. For dynamical time and frequency domain analysis, a combined time-frequency analysis in the form of short-time Fourier transform (STFT) is used, in which Fast Fourier Transform (FFT) is used in a relatively short-time sliding window, while this window could be weighted by the Gauss window function.

The disadvantage of this solution is the complexity of combined time-frequency analysis of the response signal, as a very sophisticated full spectral Fourier analysis is carried out in every short-time window, demanding a huge processing power and much computing time for calculations. This limits significantly the usage of such solutions for real-time monitoring of the objects and circuits, because and for limited by computational power of processors, which in its turn is limited by cost and available power.

Thus, there is a need for new improved method and device for frequency response measurements

DISCLOSURE OF THE INVENTION

Objective of the invention is to simplify the measurement of the frequency response, what in turn allows to use cheaper, simpler electronic devices with lower power consumption. Another objective is improved accuracy of frequency response measurements in time or frequency domain.

The objective of the invention is achieved by the invented method, comprising generating an excitation signal having relatively fast changing frequency, defined by a time-domain function, generating at least one reference signal having waveform corresponding to said excitation signal, introducing said excitation signal into the object, receiving a response signal from said object, analyzing said response signal in a signal analyzer by correlating said response signal with said at least one reference signal during a relatively short sliding time-domain window.

The relatively short time window can be further divided into several independent sliding sub-windows. The analysis could be performed digitally in one implemented correlation of the excitation signal and a reference signal, which could be the excitation signal itself It is reasonable to use a second, quadrature channel to determine the second (quadrature, imaginary) component of the response signal, e.g., the first and second reference signals, generated as sine and cosine wave chirp signals, respectively.

Alternative is to use Hilbert Transform to get the quadrature (imaginary) reference waveform from the first reference waveform.

As excitation signals, the linear, logarithmic or exponential chirp signals can be used for linear, logarithmic or exponential representation of the frequency response correspondingly. Also arbitrarily changing frequency could be used in some applications, e.g., for measurement of very specific frequency response shapes, where specific frequencies under interest are known (e.g., for eddy current measurement and validation of electrical properties of metals and metal products such as coins, when often discrete frequencies (e.g., 120, 240 and 480 kHz) are used for measurement). Furthermore, by adaptive changing the frequency dependency function of the excitation signal, or parameters of the analysis window, it is possible to classify the object under test with minimum computational and signal processing needs and achieve so the maximal processing speed, making so the proposed solution also preferable to monitor the objects with fast changing parameters.

Also, as typically measurements are carried out periodically, it is possible, according to the current measurement results (e.g., depending on the measured values and dispersion of the results in specific frequency regions), to improve the measurement accuracy and decrease the fluctuations (e.g., caused by noise) of the measurements, by adaptively changing the amplitude of the excitation signal and the length of analysis window for specific frequency regions or values.

By shape of the waveform both sine waves and non sine waves (e.g., square waves) can be used. Preferably, the beginning and ending of the short time-window are selected at zero-crossing time-instants of the excitation signal. Preferably the time-window duration is adjusted according to the running frequency of the signal, thus e.g., using for lower frequencies a longer time-window.

Alternative to usage of the two quadrature against each other reference waveforms, is to use only one, the first reference waveform, corresponding to the excitation signal waveform, by transforming the received response signal by Hilbert transform, to the complex response signal containing both direct (real) and imaginary parts and then performing the complex correlation with the first reference signals, getting a complex transfer functions for time instants and related frequency values, according to the sliding of the time domain window.

BRIEF DESCRIPTION OF THE DRAWINGS

The essence of the invention is described in FIG. 1, as a block-diagram for an example of the implementation of the invention.

EXAMPLE OF CARRYING OUT THE INVENTION

One embodiment of the invention shown on FIG. 1 comprises a unit of signal generation and data acquisition 1 for generating of the excitation signal, comprising a sine chirp waveform buffer (or generator) 2 and a cosine chirp waveform buffer (or generator) 3 (or other signals with relatively fast changing frequency). Waveform generation buffers are to be initialized with arrays of values, corresponding to the waveform, at the initialization of the whole system. In the generated waveform, the instance values of the frequency have to change relatively fast. The output of the sine chirp waveform buffer is connected, through digital-analog converter 5 (and an additional driver, if needed) into an device to be tested (DUT) 6 with unknown time variant transfer function K (t, f). It can be appreciated that instead of device, any other object with can be tested such as electrical or electronics circuits, biological objects (e.g., in bio-impedance measurements for medical diagnosis), electrochemical elements, and materials). The response signal is acquired from the object through analog-digital converter (ADC) 7 (if needed, after amplification and conditioning, not shown) into a response signal waveform buffer 4 and is further processed in a correlation unit 9 for inphase component K_real(t, f), using sine chirp as reference signal, and in a correlation unit 10 for quadrature component K_imag(t, f), using cosine chirp as reference signal. Multiply-and-accumulate (MAC) units can be used as correlation units 9 and 10 in processing signals in digital form.

Further, a relatively short time-domain sliding window, e.g., weighted by Gauss function window, which could be initialized into array of values h(t) into a sliding window h(t) buffer 8, is applied for analysis of the response signal. In the scope and with weights of the window the response signal is convolved by the reference sine and cosine wave chirps to calculate the real and imaginary parts of the response signal. As the excitation signal value is known, the transfer function of the circuit (object) under test can be calculated from this result, for the time instance (and thus, for a specific frequency). Further, a parameter of the object under investigation, e.g., unknown impedance part of the circuit can be calculated. The mentioned short-time window is sliding synchronously in all the mentioned waveform buffers: sine and cosine wave reference buffers and response signal buffer. So the value of transfer coefficient is defined just for corresponding to the sliding window position (time and frequency values) position.

Preferably chirp-signals are used, where the frequency of the signal is changing linearly or logarithmically in time, giving so linear or logarithmic frequency response function. Of course, other time dependences of the frequencies can be used, depending on the application and on which frequency-domain resolution is currently needed.

Instead the sine and cosine waveform signals in some applications non-sinusoidal waveforms, e.g., square wave signals, can be used. Such signals are easier to generate and simpler to use for correlation calculation.

Measurement could be performed in steps, by using adaptively at every step the results of the previous step for defining the parameters of the excitation signal or the analysis window.

Corresponding adaptive parameters of the excitation signal or of the analysis window can be defined for minimizing the effect of noise and measurement errors.

Corresponding adaptive parameters of the excitation signal or of the analysis window can be defined to identify an object, e.g., as 1 euro coin, 2 euro coin, or to distinguish real coin from forged coin, or to classify the measured object, e.g., by "pass" or "not pass", e.g., in a production process.

Of course, the mentioned waveforms of cosine and sine wave signals could be generated, and the response signal waveform processed, without buffers by using known analog-to-digital signal processing techniques.

Analog-to-digital and digital-to-analog converters are needed for the digital implementation of the solution (e.g., when using a digital signal processor). In analog solution, these converters are not needed and in correlation calculation the accumulation of multiplication results is changed by integration of the multiplication results.

The length of the time-domain sliding window can be implemented as dynamical and adaptive variable, being for lower frequencies longer. Preferably the beginning and ending of the sliding time-domain window are synchronized by zero-crossings of the excitation signal, so decreasing the spectral leakage of analysis, as integer number of periods of the signal is included in the analysis window.

The sliding time-domain window can consist of several sub-windows. For example, when the frequency dependence of time has the same instant value of frequency at various time instances, e.g., if the same excitation signal (burst) includes positive and negative chirp signal sequences. As the same frequency is at both positive and negative parts of the chirp, the analysis window can consist of one sub-window from the positive and the other from the negative part of the chirp.

The invention claimed is:
1. A method for measuring a frequency response of an object, the method comprising:
generating an excitation signal having relatively fast changing frequency, defined by a time-domain function;
generating at least one reference signal, having a waveform corresponding to said excitation signal;
introducing said excitation signal into the object,
receiving a response signal from said object;
analyzing said response signal in a signal analyzer by correlating said response signal with said at least one reference signal during a relatively short sliding time-domain window.

2. The method as in claim 1, wherein said relatively short sliding time-domain window is divided into several time-domain sub-windows.

3. The method as in claim 1, wherein the length of said relatively short sliding time-domain window is variable and determined by running frequency value.

4. The method as in claim 1, wherein the beginning and the end of said relatively short sliding time-domain window are chosen at zero-crossings of said excitation signal.

5. The method as in claim 1, wherein said excitation signal is generated as a sinusoidal wave.

6. The method as in claim 1, wherein the excitation signal is generated as non-sinusoidal wave.

7. The method as in claim 6, wherein said excitation signal is a square wave signal.

8. The method as in claim 1, wherein the excitation signal is generated as a chirp signal.

9. The method as in claim 8, wherein said chirp signal is a linear chirp signal.

10. The method as in claim 8, wherein said chirp signal is a nonlinear chirp signal.

11. The method as in claim 10, wherein said nonlinear chirp signal is selected from the group consisting logarithmic, exponential and arbitrarily formulated chirp signal.

12. The method as in claim 1, comprising analyzing said response signal in at least two consecutive steps, while using adaptively results of an earlier step for determining the parameters of said excitation signal or at least one analysis window for a subsequent step.

13. The method as in claim 12, wherein in said previous step the parameters of the excitation signal or of at least of one analysis window for the subsequent step are defined to minimize the effect of noise or measurement inaccuracy.

14. The method as in claim 12, wherein in said previous step the parameters of said excitation signal or of at least one analysis window for the subsequent step are defined to classify said object.

15. The method as in claim 1, wherein said reference signals are convolved in complex arithmetic in said short time-domain window by said response signal for calculation of the real and imaginary parts of the response signal, to be used for calculation of the real and imaginary parts of the object's transfer coefficient as a function of the frequency.

16. The method as in claim 1, wherein a first reference waveform corresponding to said excitation signal, is used to determine real and imaginary parts of a transfer coefficient by correlating it in the short-time window by complex representation of said response signal, given by Hilbert Transform of the acquired response signal.

17. A device for measuring of the frequency response of an object, comprising:
   a unit of signal generation and data acquisition for generating an excitation signal with a fast changing frequency to be introduced into said object and
   a response-signal analyzer adapted to receive a response signal from said object,
   said response-signal analyzer working in a short time window, wherein the analyzer comprises a first unit adapted to generate a first reference waveform that is in phase with the excitation signal, and a second unit adapted to generate a second reference waveform that is in quadrature with the excitation signal,
   wherein the waveforms of the first and second excitation signals are defined by said excitation signal waveform, and means for correlating said response waveform with the first reference waveform and with the second reference waveform in a short time-domain window.

* * * * *